(12) United States Patent
Li et al.

(10) Patent No.: US 11,621,349 B2
(45) Date of Patent: Apr. 4, 2023

(54) NANO-WALL INTEGRATED CIRCUIT STRUCTURE WITH HIGH INTEGRATED DENSITY

(71) Applicant: University of Electronic Science and Technology of China, Chengdu (CN)

(72) Inventors: Ping Li, Chengdu (CN); Yongbo Liao, Chengdu (CN); Xianghe Zeng, Chengdu (CN); Yaosen Li, Chengdu (CN); Ke Feng, Chengdu (CN); Chenxi Peng, Chengdu (CN); Zhaoxi Hu, Chengdu (CN); Fan Lin, Chengdu (CN); Xuanlin Xiong, Chengdu (CN); Tao He, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 0 days.

(21) Appl. No.: 17/367,573

(22) Filed: Jul. 5, 2021

(65) Prior Publication Data

US 2022/0149198 A1 May 12, 2022

(30) Foreign Application Priority Data

Nov. 10, 2020 (CN) .......................... 202011244744.X

(51) Int. Cl.
*H01L 29/78* (2006.01)
*H01L 29/417* (2006.01)
*H01L 29/10* (2006.01)

(52) U.S. Cl.
CPC ...... *H01L 29/7827* (2013.01); *H01L 29/1037* (2013.01); *H01L 29/41741* (2013.01); *H01L 29/7833* (2013.01)

(58) Field of Classification Search
CPC ............. H01L 29/7827; H01L 29/1037; H01L 29/41741; H01L 29/7833; H01L 29/42356; H01L 29/7809; H01L 29/0657; H01L 29/7834
See application file for complete search history.

(56) References Cited

U.S. PATENT DOCUMENTS 7,315,051 B2 * 1/2008 Cheng ............. H01L 21/823418
257/E21.619
7,550,803 B1 * 6/2009 Huang ................ H01L 29/7813
257/330

\* cited by examiner

*Primary Examiner* — Shahed Ahmed
*Assistant Examiner* — Khatib A Rahman
(74) *Attorney, Agent, or Firm* — Andrew D. Fortney; Central California IP Group, P.C.

(57) ABSTRACT

A nano-wall integrated circuit structure with high integration density is disclosed, which relates to the fields of microelectronic technology and integrated circuits (IC). Based on the different device physical principles with MOSFETs in traditional ICs, the nano-wall integrated circuit unit structure (Nano-Wall FET, referred to as NWaFET) with high integration density can improve the integration of the IC, significantly shorten the channel length, improve the flexibility of the device channel width-to-length ratio adjustment, and save chip area.

20 Claims, 14 Drawing Sheets

NANO-WALL INTEGRATED CIRCUIT STRUCTURE WITH HIGH INTEGRATED DENSITY

TECHNICAL FIELD

The invention relates to the field of microelectronics technology and integrated circuits.

BACKGROUND TECHNIQUE

The traditional planar MOSFET structure after 22 nm was gradually replaced by the three-dimensional FINFET. FINFET was formally published in a paper by Professor Hu Chenming of the University of California, Berkeley in 2000; the channel region of FINFET is a fin-shaped semiconductor wrapped on three sides of the gate. The three-sided gate structure enhances the gate control ability and effectively suppresses the short channel effect, and allows the continuation of Moore's law. Following the idea of FINFET's three-sided gate structure, after the 5 nm node, people proposed a four-sided gate structure GAAFET (Gate-All-Around Field Effect Transistor) structure.

MOSFET is divided into N-type and P-type. N-type carriers are electrons, P-type carriers are holes, and the electron mobility is about 3 times the hole mobility. Therefore, in the CMOS process, in order to form symmetrical complementary electrical characteristics, under the same channel length condition, the channel width of each PMOS is 3 times the width of the NMOS. In traditional planar MOSFET, the method of folding gate is often used to widen the channel. In FINFET, it is mostly realized by the method of 3 PMOS in parallel, both of which greatly increase the area of the integrated circuit and limit the improvement of integration.

The DIBL (Drain Induced Barrier Reduction) effect is the main problem that prevents the planar MOSFET from shrinking further after entering the less than 22 nm process node. In the past ten years, people have adopted methods such as FDSOI, FINFET and GAAFET to overcome the DIBL effect of short-channel MOSFETs by using the MOS gate function to "fully deplete" the channel region on the basis of "scale reduction". FINFET and GAA based on the full depletion theory must wrap the channel region on three or four sides in order to realize the MOSFET function. Taking NMOSFET as an example, the principle of full depletion requires P-Well to be intrinsic or low-doped; its negative effects are: first, the silicon channel region needs to be wrapped with the gate, thereby reducing the integration; second, the channel width-to-length ratio of MOSFET is very inconvenient to adjust. As far as FINFET is concerned, under the condition that the height and width of Fin are fixed by the process and $L_{ch}$ is already the smallest, the only way to increase the channel width-to-length ratio can be multi-tube parallel connection. Multi-tube paralleling means that the channel width-to-length ratio is achieved in a way that increases exponentially. This is undoubtedly very inconvenient for analog ICs that require precise control of the aspect ratio.

The structures of traditional MOSFETs, including planar MOSFETs, SOIFETs, FINFETs and GAAFETs, taking NMOSFET as an example, determine that the doping concentration of P-Well is much lower than that of the source and drain regions. Even if the lightly doped source and drain regions (LDD) exist, this situation cannot be fundamentally changed. Because the term "lightly doped source and drain regions" refers to "lightly doped" in terms of heavily doped source and drain regions. The doping concentration of LDD must be higher than that of P-Well. This is determined by the silicon gate source-drain self-aligned ion implantation (including annealing) process. The avalanche breakdown voltage of the PN junction is determined by the low doping concentration side, that is, the P-Well concentration and the channel length $L_{ch}$ determine the avalanche breakdown voltage $BV_{DS}$ of the traditional MOSFET. For this reason, IEEE IRDS [3] predicts: In the future, the speed of Moore's Law will be slower and slower, and the gate length of a single transistor will slowly shrink. Until 2028, $L_{ch}$ will shrink to 12 nm. After that, $L_{ch}$ will no longer be able to shrink again. Before the 28 nm process node, $L_{ch}$ can always be reduced with the feature size Lf, so the integration level of IC doubles every 18 to 24 months. This is the core content of Moore's Law. In 2028, after entering the 1.5 nm process node, $L_{ch}$ can no longer shrink; this means that Moore's Law will end at that time. Due to the operating frequency of MOSFET $f_0 \sim 1/L_{ch}^2$, this means that the existing FINFET and GAAFET high frequency applications are limited.

SUMMARY OF THE INVENTION

This invention aims to provide a basic structure of IC whose integration level is better than FinFET and GAAFET, with the shortest channel length $L_{ch}$ significantly shorter than those of FinFET and GAAFET, and that has the convenience of MOSFET gate width-to-length ratio adjustment significantly better than those of FinFET and GAAFET, which is called the Nano-Wall FET structure, hereinafter referred to as the NWaFET structure.

The first technical embodiment of this invention is a nano-wall integrated circuit structure with high integration density, as shown in FIG. 1. At the bottom of the structure, there is a P-Well semiconductor region 105, and the N+ heavily doped drain region 104 of NWaFET is formed on the upper part of the P-Well semiconductor region 105; above the N+ heavily doped drain region 104 there is an N- lightly doped drain region 103; above the N- lightly doped drain region 103 there is a P+ type channel semiconductor region 102; above the P+ type channel semiconductor region 102 there is an N+ heavily doped source region 101 that comprises a narrow bandgap pseudocrystalline, narrow bandgap polycrystalline or single crystal silicon semiconductor; the N+ heavily doped drain region 104 includes an upper portion and a lower portion, the lower portion is wider than the upper portion, and the bottom surface and side surfaces of the lower portion are surrounded by the P-Well 105. A trench is provided on or adjacent to the upper part of the above-mentioned N+ heavily doped drain region 104, and the side surfaces of the N- lightly doped drain region 103, the P+ type channel semiconductor region 102, and the N+ heavily doped source region 101. The bottom surface of the trench is lower than the contact surface of the N- lightly doped drain region 103 and the N+ heavily doped drain region 104, and higher than the bottom surface of the N+ heavily doped drain region 104; the trench is filled with a gate electrode 106 and an insulating gate dielectric 107. The gate electrode 106 comprises heavily doped polycrystalline or refractory metal silicide or refractory metal or a combination thereof them. The insulated gate dielectric 107 is used to isolate the gate electrode 106 and other semiconductor functional regions. The drain electrode 108 is arranged on the side surfaces of the N+ heavily doped source region 101, P+ type channel semiconductor region 102, the N- lightly doped drain region 103, and the N+ heavily doped drain region 104, and is isolated from the N+ heavily doped source region 101, P+ type channel semiconductor region 102 and the N− lightly doped drain region 103 by the insulating material 109; the drain electrode 108 is in contact with the N+ heavily doped drain region 104, and the contact surface is lower than the contact surfaces of the N− lightly doped drain region 103 and the N+ heavily doped drain region 104.

The second technical embodiment of this invention is another nano-wall integrated circuit structure with high integration density, as shown in FIG. 2. At the bottom of the structure, there is a P-Well semiconductor region 105, and the N+ heavily doped drain region 104 of NWaFET is formed on the upper part of the P-Well semiconductor region 105; above the N+ heavily doped drain region 104 there is an N− lightly doped drain region 103; above the N− lightly doped drain region 103 there is a P+ type channel semiconductor region 102; above the P+ type channel semiconductor region 102 there is an N+ heavily doped source region 101 that comprises a narrow bandgap pseudocrystalline, narrow bandgap polycrystalline or single crystal silicon semiconductor; the N+ heavily doped drain region 104 includes an upper portion and a lower portion, the lower portion is wider than the upper portion, and the bottom surface and side surfaces of the lower portion are surrounded by P-Well 105. A trench is provided on or adjacent to the upper part of the above-mentioned N+ heavily doped drain region 104, and the side surfaces of the N− lightly doped drain region 103, the P+ type channel semiconductor region 102, and the N+ heavily doped source region 101, the bottom surface of the trench is lower than the contact surface of the P+ channel semiconductor region 102 and the N− lightly doped drain region 103, and higher than the contact surface of the N− lightly doped drain region 103 and the N+ heavily doped drain region 104; the trench is filled with the gate electrode 106 and the insulated gate dielectric 107. The gate electrode 106 comprises heavily doped polycrystalline or refractory metal silicide or refractory metal or a combination thereof. The insulated gate dielectric 107 is used to isolate the gate electrode 106 and other semiconductor functional regions; the drain electrode 108 is arranged on the side surfaces of the N+ heavily doped source region 101, the P+ type channel semiconductor region 102, the N− lightly doped drain region 103, and the N+ heavily doped drain region 104, and is isolated from the N+ heavily doped source region 101, the P+ type channel semiconductor region 102, and the N− lightly doped drain region 103 by the insulating material 109; the drain electrode 108 is in contact with the N+ heavily doped drain region 104, and the contact surface is lower than the contact surfaces of the N− lightly doped drain region 103 and the N+ heavily doped drain region 104.

The third technical embodiment of this invention is another nano-wall integrated circuit structure with high integration density, as shown in FIG. 3. At the bottom of the structure there is a P-Well semiconductor region 105, and the N+ heavily doped drain region 104 of NWaFET is formed on the upper part of the P-Well semiconductor region 105; above the N+ heavily doped drain region 104 there is an N− lightly doped drain region 103; above the N− lightly doped drain region 103 there is a P+ type channel semiconductor region 102; above the P+ type channel semiconductor region 102 there is an N− lightly doped source region 110; above the N− lightly doped source region 110 there is an N+ heavily doped source region 101 that comprises a narrow bandgap pseudocrystalline, narrow bandgap polycrystalline or single crystal silicon semiconductor; the N+ heavily doped drain region 104 includes an upper portion and a lower portion, the lower portion is wider than the upper portion, and the bottom surface and side surfaces of the lower portion are surrounded by P-Well 105. A trench is provided on or adjacent to the upper part of the above-mentioned N+ heavily doped drain region 104, and the side surfaces of the N− lightly doped drain region 103, the P+ channel semiconductor region 102, the N− lightly doped source region 110 and the N+ heavily doped source region 101, and the bottom surface of the trench is lower than the contact surface of the N− lightly doped drain region 103 and the N+ heavily doped drain region 104, and higher than the bottom surface of the N+ heavily doped drain region 104; the trench is filled with a gate electrode 106 and an insulating gate dielectric 107. The gate electrode 106 comprises heavily doped polycrystalline or refractory metal silicide or refractory metal or the combination thereof. The insulating gate dielectric 107 is used to isolate the gate electrode 106 and other semiconductor functional regions; the drain electrode 108 is arranged on the side surfaces of the N+ heavily doped source region 101, the P+ type channel semiconductor region 102, the N− lightly doped drain region 103, and the N+ heavily doped drain region 104, and is isolated from the N+ heavily doped source region 101, the P+ type channel semiconductor region 102, and the N− lightly doped drain region 103 by the insulating material 109; the drain electrode 108 is in contact with the N+ heavily doped drain region 104, and the contact surface is lower than the contact surface of the N− lightly doped drain region 103 and the N+ heavily doped drain region 104; The N− lightly doped source region 110 comprises a narrow bandgap pseudocrystalline, narrow bandgap polycrystalline or single crystal silicon semiconductor, and the N− lightly doped source region 110 has a doping concentration that is lower than that of the N+ heavily doped source region 101 and the P+ type channel semiconductor region 102.

The fourth technical embodiment of this invention is another nano-wall integrated circuit structure with high integration density, as shown in FIG. 4. At the bottom of the structure there is a P-Well semiconductor region 105, and an NWaFET N+ heavily doped drain region 104 is formed on the upper part of the P− Well semiconductor region 105; above the N+ heavily doped drain region 104 there is an N− lightly doped drain region 103; above the N− lightly doped drain region 103 there is a P+ type channel semiconductor region 102; above the P+ type channel semiconductor region 102 there is an N− lightly doped source region 110; above the N− lightly doped source region 110 there is an N+ heavily doped source region 101 that comprises a narrow bandgap pseudocrystalline, narrow bandgap polycrystalline or single crystal silicon semiconductor; the N+ heavily doped drain region 104 includes an upper portion and a lower portion, the lower part is wider than the upper part, and the bottom surface and side surfaces of the lower part are surrounded by P-Well 105. A trench is provided on or adjacent to the upper part of the above-mentioned N+ heavily doped drain region 104, and on the sides of the N− lightly doped drain region 103, the P+ type channel semiconductor region 102, the N− lightly doped source region 110 and the N+ heavily doped source region 101, the bottom surface of the trench is lower than the contact surface of the P+ type channel semiconductor region 102 and the N− lightly doped drain region 103, and higher than the contact surface of the N− lightly doped drain region 103 and the N+ heavily doped drain region 104; the trench is filled with a gate electrode 106 and an insulating gate dielectric 107. The gate electrode 106 comprises heavily doped polycrystalline or refractory metal silicide or refractory metal or a combination thereof. The insulating gate dielectric 107 is used to isolate the gate electrode 106 and other semiconductor functional regions. The drain electrode 108 is arranged on the side surfaces of the N+ heavily doped source region 101, the N− lightly doped source region 110, the P+ type channel semiconductor region 102, the N− lightly doped drain region 103, and the N+ heavily doped drain region 104, and is isolated from the N+ heavily doped source region 101, P+ type channel semiconductor region 102, N− lightly doped drain region 103 by the insulating material 109; the drain electrode 108 is in contact with the N+ heavily doped drain region 104, and the contact surface is lower than the contact surface of the N− lightly doped drain region 103 and the N+ heavily doped drain region 104; The N− lightly doped source region 110 comprises a narrow bandgap pseudocrystalline, narrow bandgap polycrystalline or single crystal silicon semiconductor, and the N− lightly doped source region 110 has a doping concentration that is lower than that of the N+ heavily doped source region 101 and the P+ type channel semiconductor region 102.

The fifth technical embodiment of this invention is another nano-wall integrated circuit structure with high integration density, as shown in FIG. 5. At the bottom of the structure there is an N-Well semiconductor region 115, and a P+ heavily doped drain region 114 of NWaFET is formed on the upper part of the N-Well semiconductor region 115; above the P+ heavily doped drain region 114 there is a P− lightly doped drain region 113; above the P− lightly doped drain region 113 there is an N+ type channel semiconductor region 112; above the N+ type channel semiconductor region 112 there is a P+ heavily doped source region 111 that comprises a narrow bandgap pseudocrystalline, narrow bandgap polycrystalline or single crystal silicon semiconductor; the P+ heavily doped drain region 114 includes an upper portion and a lower portion, the lower portion is wider than the upper portion, and the bottom surface and side surfaces of the lower portion are surrounded by N-Well 115. A trench is provided on or adjacent to the upper portion of the P+ heavily doped drain region 114, and the side surfaces of the P− lightly doped drain region 113, N+ type channel semiconductor region 112, and P+ heavily doped source region 111, and the bottom surface of the trench is lower than the contact surface of the P− lightly doped drain region 113 and the P+ heavily doped drain region 114, and higher than the bottom surface of the P+ heavily doped drain region 114; the trench is filled with gate electrode 106 and insulating gate dielectric 107. The gate electrode 106 comprises heavily doped polycrystalline or refractory metal silicide or refractory metal or a combination thereof. The insulating gate dielectric 107 is used to isolate the gate electrode 106 and other semiconductor functional regions. The drain electrode 108 is arranged on the side surfaces of the P+ heavily doped source region 111, the N+ type channel semiconductor region 112, the P− lightly doped drain region 113 and the upper part of the P+ heavily doped drain region 114, and is isolated from the P+ heavily doped source region 111, the N+ type channel semiconductor region 112, and the P− lightly doped drain region 113 by the insulating material 109; the drain electrode 108 is in contact with the P+ heavily doped drain region 114, and the contact surface is lower than the contact surfaces of the drain region 113 and the P+ heavily doped drain region 114.

The sixth technical embodiment of this invention is another nano-wall integrated circuit structure with high integration density, as shown in FIG. 6. At the bottom of the structure there is an N-Well semiconductor region 115, and the P+ heavily doped drain region 114 of NWaFET is formed on the upper part of the N-Well semiconductor region 115; above the P+ heavily doped drain region 114 there is a P− lightly doped drain region 113; above the P− lightly doped drain region 113 there is an N+ type channel semiconductor region 112; above the N+ type channel semiconductor region 112 there is a P+ heavily doped source region 111 that comprises a narrow bandgap pseudocrystalline, narrow bandgap polycrystalline or single crystal silicon semiconductor; the P+ heavily doped drain region 114 includes an upper portion and a lower portion, the lower portion is wider than the upper portion, and the bottom surface and side surfaces of the lower portion are surrounded by N-Well 115. A trench is provided on or adjacent to the upper portion of the P+ heavily doped drain region 114, and the side surfaces of the P− lightly doped drain region 113, N+ type channel semiconductor region 112, and P+ heavily doped source region 111, and the bottom surface of the trench is lower than the contact surface of the N+ type channel semiconductor region 112 and the P− lightly doped drain region 113, and higher than the bottom surface of the P− lightly doped drain region 113; the trench is filled with gate electrode 106 and insulating gate dielectric 107. The gate electrode 106 comprises heavily doped polycrystalline or refractory metal silicide or refractory metal or a combination thereof them. The insulating gate dielectric 107 is used to isolate gate electrode 106 and other semiconductor functional regions; the drain electrode 108 is arranged on the side surfaces of the P+ heavily doped source region 111, the N+ type channel semiconductor region 112, the P− lightly doped drain region 113, and the P+ heavily doped drain region 114, and is isolated from the P+ heavily doped source region 111, the N+ type channel semiconductor region 112, and the P− lightly doped drain region 113 by the insulating material 109; the drain electrode 108 is in contact with the P+ heavily doped drain region 114, and the contact surface is lower than the contact surfaces of the P− lightly doped drain region 113 and the P+ heavily doped drain region 114.

The seventh technical embodiment of this invention is another nano-wall integrated circuit structure with high integration density, as shown in FIG. 7. At the bottom of the structure there is an N-Well semiconductor region 115, and the P+ heavily doped drain region 114 of NWaFET is formed on the upper part of the N-Well semiconductor region 115; above the P+ heavily doped drain region 114 there is a P-lightly doped drain region 113; above the P− lightly doped drain region 113 there is an N+ type channel semiconductor region 112; above the N+ type channel semiconductor region 112 there is a P− lightly doped source region 116; above the P− lightly doped source region 116 there is a P+ heavily doped source region 111 that comprises a narrow bandgap pseudocrystalline, narrow band polycrystalline or single crystal silicon semiconductor; the P+ heavily doped drain region 114 includes an upper portion and a lower portion, the lower portion is wider than the upper portion, and the bottom surface and side surfaces of the lower portion are surrounded by N-Well 115. A trench is provided on or adjacent to the upper part of the P+ heavily doped drain region 114, and the side surfaces of the P− lightly doped drain region 113, the N+ type channel semiconductor region 112, the P− lightly doped source region 116, and the P+ heavily doped source region 111. The bottom surface of the trench is lower than the contact surfaces of the P− lightly doped drain region 113 and the P+ heavily doped drain region 114, and higher than the bottom surface of the P+ heavily doped drain region 114; the trench is filled with the gate electrode 106 and the insulating gate dielectric 107. The gate electrode 106 comprises heavily doped polycrystalline or refractory metal silicide or refractory metal or a combination thereof them. The insulating gate dielectric 107 is used to isolate the gate electrode 106 from other semiconductor functional regions; the drain electrode 108 is arranged on the side surfaces of the P+ heavily doped source region 111, the P− lightly doped source region 116, the N+ type channel semiconductor region 112, the P− lightly doped drain region 113, and the P+ heavily doped drain region 114, and is isolated from the P+ heavily doped source region 111, the P− lightly doped source region 116, the N+ type channel semiconductor region 112, and the P− lightly doped drain region 113 by the insulating material 109; the drain electrode 108 is in contact with the P+ heavily doped drain region 114, and the contact surface is lower than the contact surfaces of the P− lightly doped drain region 113 and the P+ heavily doped drain region 114; The P− lightly doped source region 116 comprises a narrow bandgap pseudocrystalline, narrow bandgap polycrystalline or single crystal silicon semiconductor, and the P− lightly doped source region 116 has a doping concentration that is lower than that of the P+ heavily doped source region 111 and the N+ type channel semiconductor region 112.

The eighth technical embodiment of this invention is another nano-wall integrated circuit structure with high integration density, as shown in FIG. 8. At the bottom of the structure, there is an N-Well semiconductor region 115, and the P+ heavily doped drain region 114 of NWaFET is formed on the upper part of the N-Well semiconductor region 115; above the P+ heavily doped drain region 114 there is a P− lightly doped drain region 113; above the P− lightly doped drain region 113 there is an N+ type channel semiconductor region 112; above the N+ type channel semiconductor region 112 there is a P− lightly doped source region 116; above the P− lightly doped source region 116 there is a P+ heavily doped source region 111 that comprises a narrow bandgap pseudocrystalline, narrow bandgap polycrystalline or single crystal silicon semiconductor; the P+ heavily doped drain region 114 includes an upper portion and a lower portion, the lower portion is wider than the upper portion, and the bottom surface and side surfaces of the lower portion are surrounded by N-Well 115. A trench is provided on or adjacent to the upper part of the P+ heavily doped drain region 114, and the side surfaces of the P− lightly doped drain region 113, the N+ type channel semiconductor region 112, the P− lightly doped source region 116, and the P+ heavily doped source region 111, and the bottom surface of the trench is lower than the contact surfaces of the N+ channel semiconductor region 112 and the P− lightly doped drain region 113, and higher than the bottom surface of the P− lightly doped drain region 113; The trench is filled with a gate electrode 106 and an insulating gate dielectric 107. The gate electrode 106 comprises heavily doped polycrystalline or refractory metal silicide or refractory metal or a combination thereof. The insulating gate dielectric 107 is used to isolate the gate electrode 106 and other semiconductor functional regions; the drain electrode 108 is arranged on the side surfaces of the P+ heavily doped source region 111, P− lightly doped source region 116, N+ type channel semiconductor region 112, P-lightly doped drain region 113, and P+ heavily doped drain region 114, and is isolated from the P+ heavily doped source region 111, P− lightly doped source region 116, N+ type channel semiconductor region 112, and P− lightly doped drain region 113 by the insulating material 109; the drain electrode 108 is in contact with P+ heavily doped drain region 114, and the contact surface is lower than the contact surfaces of the P-lightly doped drain region 113 and the P+ heavily doped drain region 114; The P− lightly doped source region 116 comprises a narrow bandgap pseudocrystalline, narrow bandgap polycrystalline or single crystal silicon semiconductor, and the P− lightly doped source region 116 has a doping concentration that is lower than that of the P+ heavily doped source region 111 and the N+ type channel semiconductor region 112.

In some embodiments, the thickness of the P+ type channel semiconductor region 102 is less than 12 nm.

In other or further embodiments, the doping concentration of the P+ type channel semiconductor region 102 is higher than that of the N− lightly doped drain region 103 by more than 2 orders of magnitude.

In some embodiments, the thickness of the N+ type channel semiconductor region 112 is less than 12 nm.

In other of further embodiments, the doping concentration of the N+ type channel semiconductor region 112 is higher than that of the P− lightly doped drain region 113 by more than 2 orders of magnitude.

In some embodiments, the gate electrode 106 is arranged on the entire area of one side surface of the semiconductor PN functional region or the partial area of one side surface of the semiconductor PN functional area, as shown in FIG. 13(a).

In some other embodiments, the gate electrode 106 is arranged on the entire area of the two side surfaces of the semiconductor PN functional region, or the entire area of one side surface of the semiconductor PN functional region and the partial area of the adjacent side of the side, as shown in FIG. 13(b).

In still other embodiments, the gate electrode 106 is arranged on the entire area of the three side surfaces of the semiconductor PN functional region or the entire area of the two adjacent side surfaces of the semiconductor PN functional region and the partial area of the side of the adjacent to one of the two adjacent side surfaces, as shown in FIG. 13(c).

In yet other embodiments, the gate electrode 106 is arranged on the entire area of the four side surfaces of the semiconductor PN functional region, or the entire area of the three adjacent side surfaces of the semiconductor PN functional region and the partial area of the last side surface, as shown in FIG. 13(d).

The gate depth of the NWaFET can be selected according to different usage requirements. Taking NMOSFET as an example, in low-frequency applications, the gate can be relatively deep. For example, the gate depth may be lower than the contact surface of the N− lightly doped drain region 103 and the N+ heavily doped drain region 104, and higher than the bottom surface of the N+ heavily doped drain region 104. The parasitic capacitance at this depth does not significantly affect low-frequency applications, and can bring a lower on-resistance $R_{ON}$, which is beneficial to increase the on-current and increase the driving capability of the transistor. In high-frequency applications, excessive parasitic capacitance may significantly affect the performance of the transistor, so the gate should not be too deep. For such applications, the gate depth may be lower than the contact surface of the P+ channel region 102 and the N-lightly doped drain region 103, and higher than the bottom surface of the N− lightly doped drain region 103.

The NWaFET proposed by this invention adopts a completely different mechanism from the full depletion principle of FINFET and GAAFET to suppress the DIBL effect. The channel region of the NWaFET is highly doped, and the concentration of the channel region is higher than that of the N− lightly doped drain region. The $BV_{DS}$ of the device is determined by the length and concentration of the N− lightly doped drain region, which avoids the high field effect of the above-mentioned channel region. As a result, the $L_{ch}$ can be shrunk to a very small size. The drain depletion region approximately extends only in the drift region, and the shape of the barrier in the channel region is almost unchanged. Therefore, the NWaFET can suppress the DIBL effect very well, and the gate does not need to wrap the channel region. A non-leakage MOSFET can be formed on one side of the silicon wall. This saves chip area compared with the three-sided or four-sided channel of FINFET and GAAFET, which significantly improves the integration of IC transistors.

This invention is based on a new principle of inhibiting the DIBL effect, and proposes an NWaFET structure that can realize a single-sided channel. Compared with FINFETs and GAAFETs, an NWaFET with a single-sided channel saves chip area relative to a similar transistor with a three-sided or four-sided channel, and its $L_{ch}$ can be much smaller than that of FINFETs and GAAFETs. Compared with traditional planar MOSFETs, the NWaFET is a three-dimensional structure, so the degree of integration is significantly improved.

An AND gate, OR gate or inverter can be realized by using the basic N-type NWaFET and P-type NWaFET. As a result, digital IC can be easily realized through the combination of AND gates, OR gates and inverters. In terms of digital IC, the advantages of NWaFET integration and speed improves the performance of digital IC chips and reduces the chip area. In terms of analog IC, NWaFETs can adjust the channel width-to-length ratio flexibly and conveniently, and because it can further reduce the channel length $L_{ch}$, it has better application prospects in the high-frequency field.

EXAMPLES

Example 1

Figure 1:
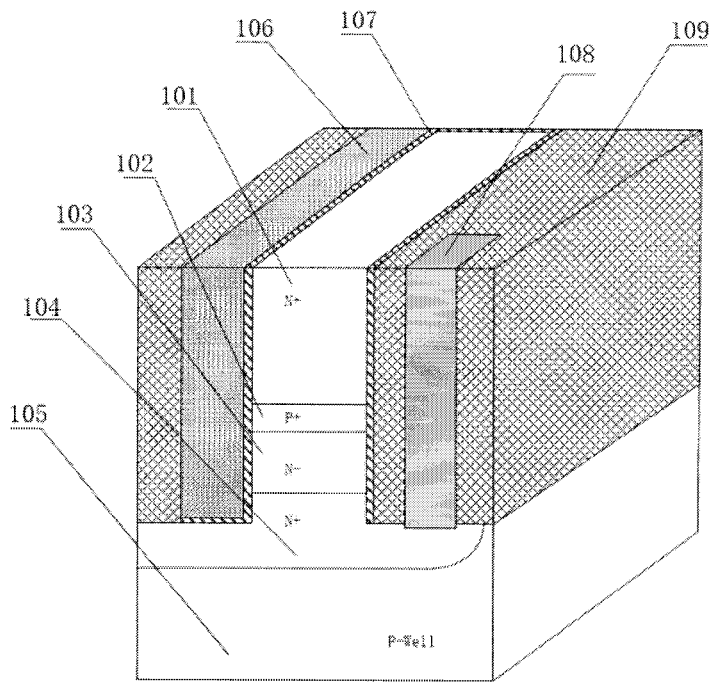
FIG. 1 is the oblique cross-sectional view of a deep gate trench NMOSFET unit with a nano-wall integrated circuit structure with high integration density without N-lightly doped source region of one embodiment of this invention.
Figure 2:
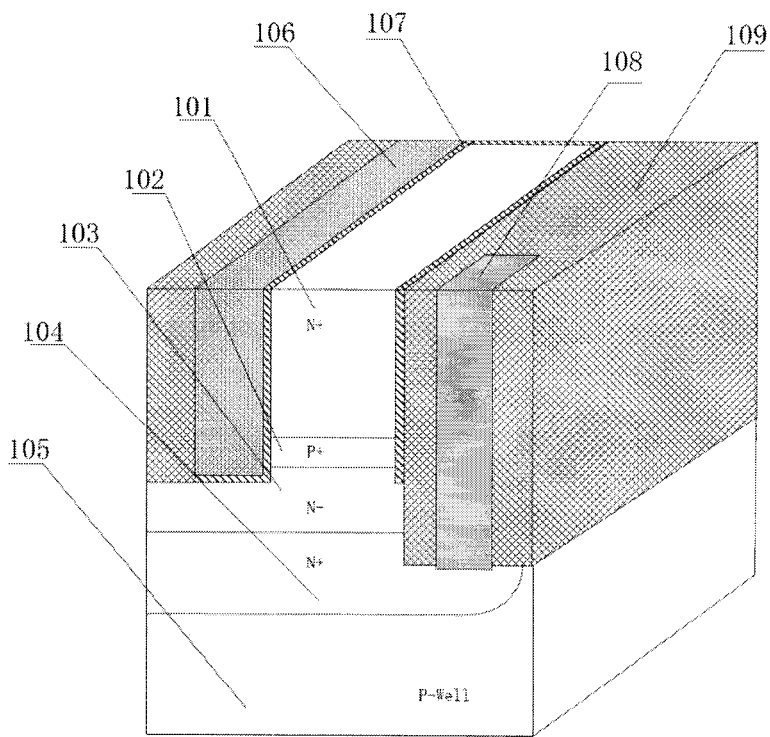
FIG. 2 is the oblique cross-sectional view of a shallow gate trench NMOSFET unit with a nano-wall integrated circuit structure with high integration density without N-lightly doped source region of one embodiment of this invention.
Figure 3:
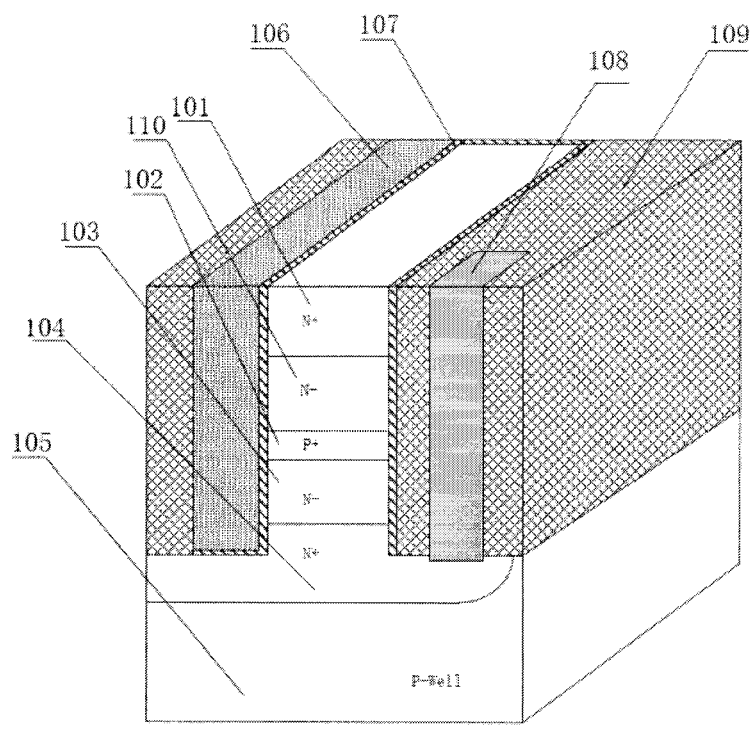
FIG. 3 is the oblique cross-sectional view of a deep gate trench NMOSFET unit with a nano-wall integrated circuit structure with high integration density with N-lightly doped source region of one embodiment of this invention.
Figure 4:
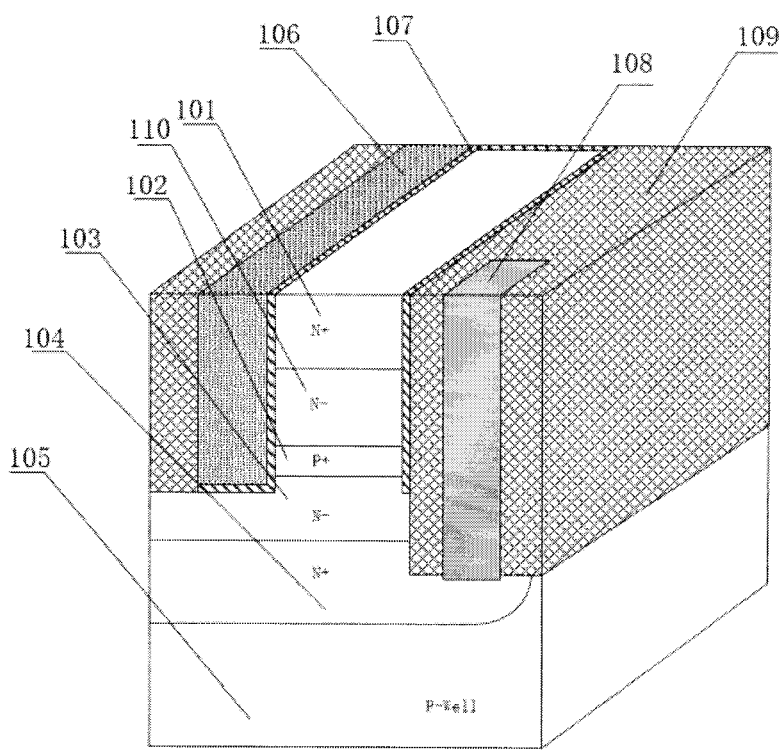
FIG. 4 is the oblique cross-sectional view of a shallow gate trench NMOSFET unit with a nano-wall integrated circuit structure with high integration density with N-lightly doped source region of one embodiment of this invention.
Figure 5:
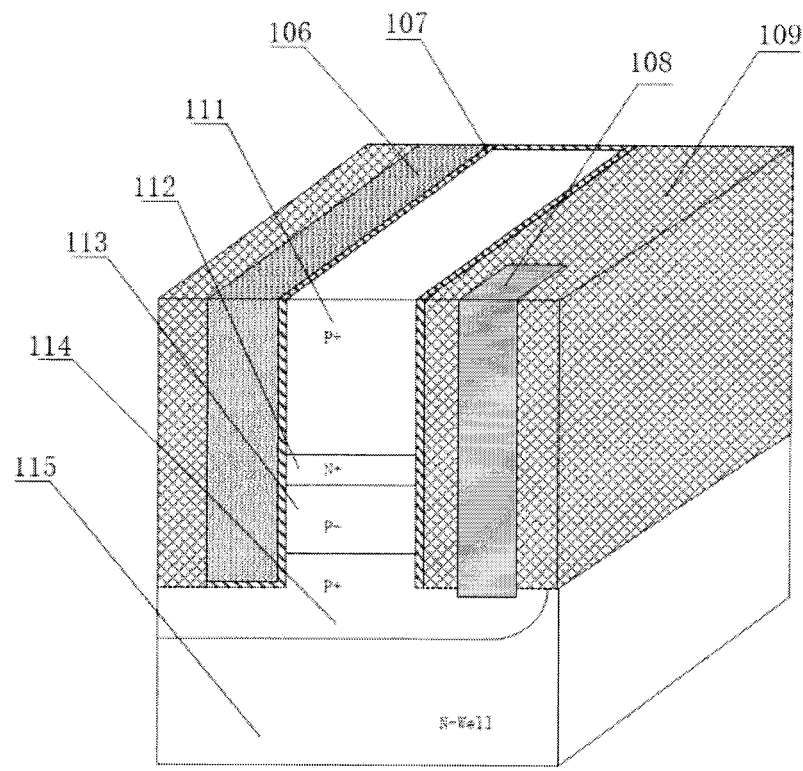
FIG. 5 is the oblique cross-sectional view of a deep gate trench PMOSFET unit with a nano-wall integrated circuit structure with high integration density without P-lightly doped source region of one embodiment of this invention.
Figure 6:
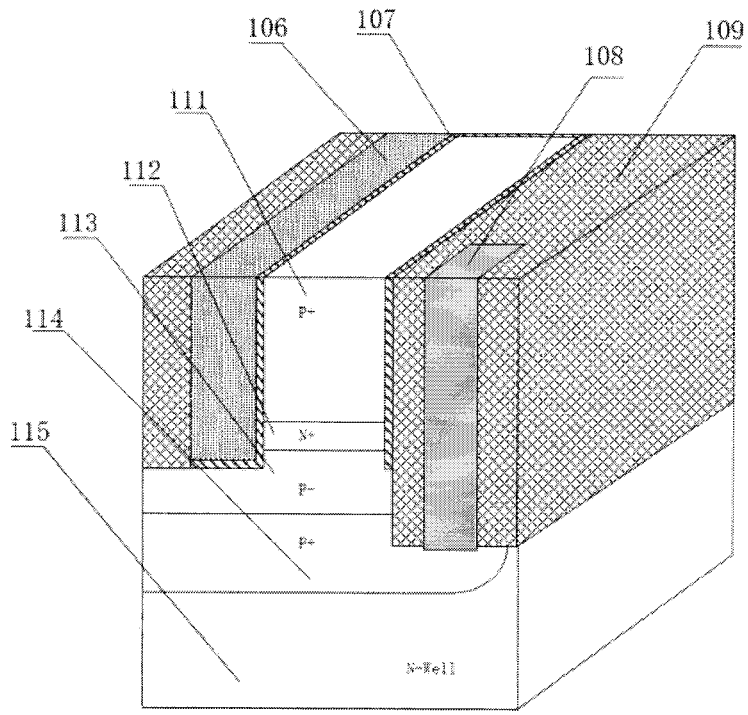
FIG. 6 is the oblique cross-sectional view of a shallow gate trench PMOSFET unit with a nano-wall integrated circuit structure with high integration density without P-lightly doped source region of one embodiment of this invention.
Figure 7:
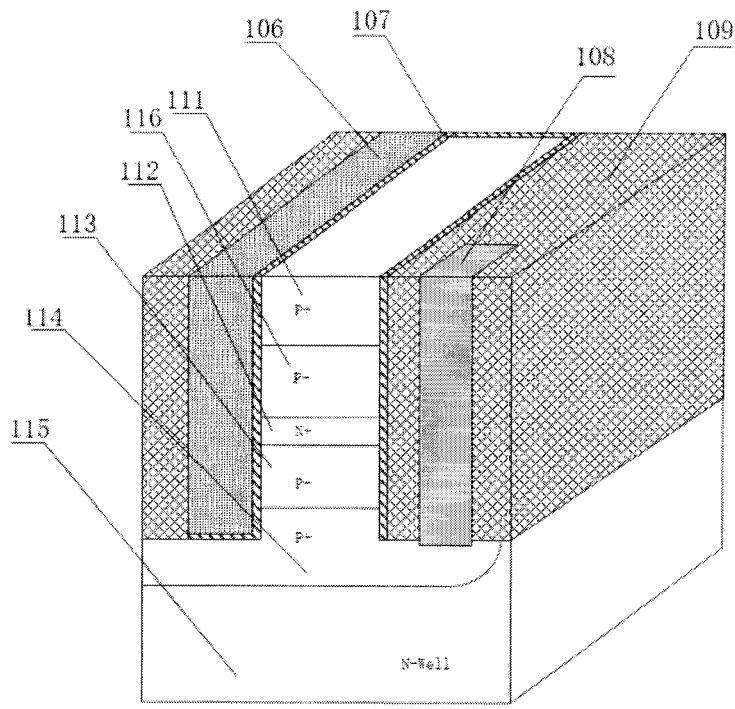
FIG. 7 is the oblique cross-sectional view of a deep gate trench PMOSFET unit with a nano-wall integrated circuit structure with high integration density with P− lightly doped source region of one embodiment of this invention.
Figure 8:
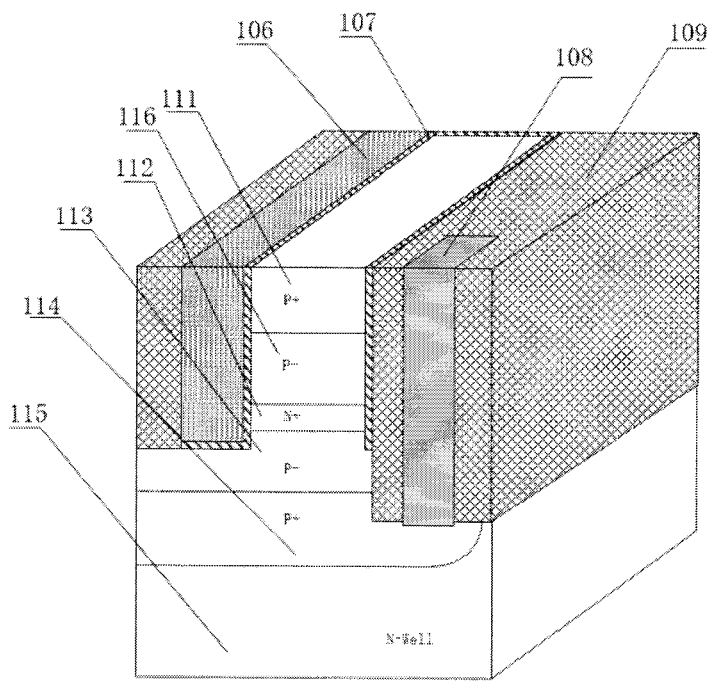
FIG. 8 is the oblique cross-sectional view of a shallow gate trench PMOSFET unit with a nano-wall integrated circuit structure with high integration density with P− lightly doped source region of one embodiment of this invention.
Figure 9:
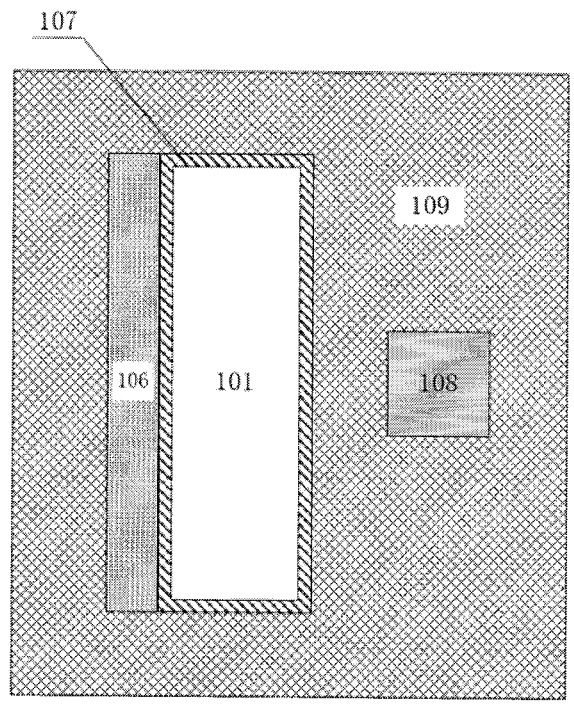
FIG. 9 is the top view of a structure NMOSFET unit of a nano-wall integrated circuit structure with high integration density of one or more embodiments of this invention.
Figure 10:
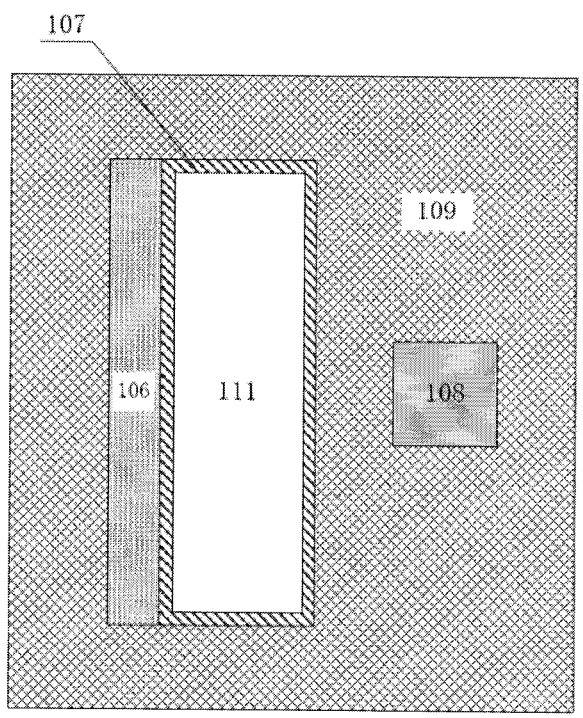
FIG. 10 is the top view of a structure PMOSFET unit of a nano-wall integrated circuit structure with high integration density of one or more embodiments of this invention.
Figure 11:
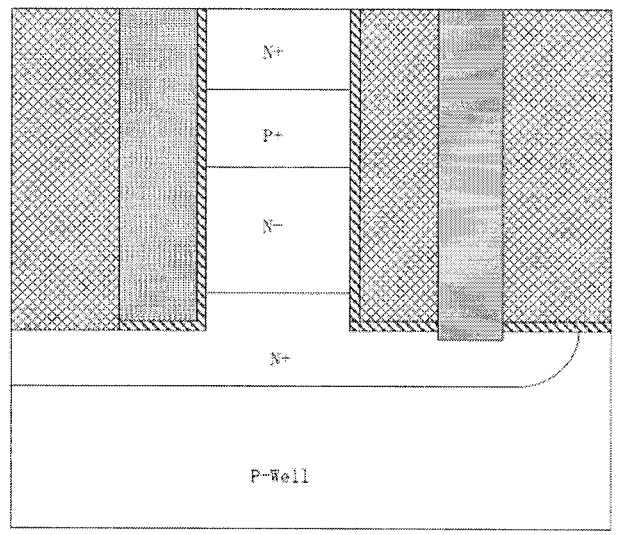
FIG. 11 is the cross-sectional view of a deep gate trench NMOSFET unit with a nano-wall integrated circuit structure with high integration density without N− lightly doped source region of one embodiment of this invention.
Figure 12:
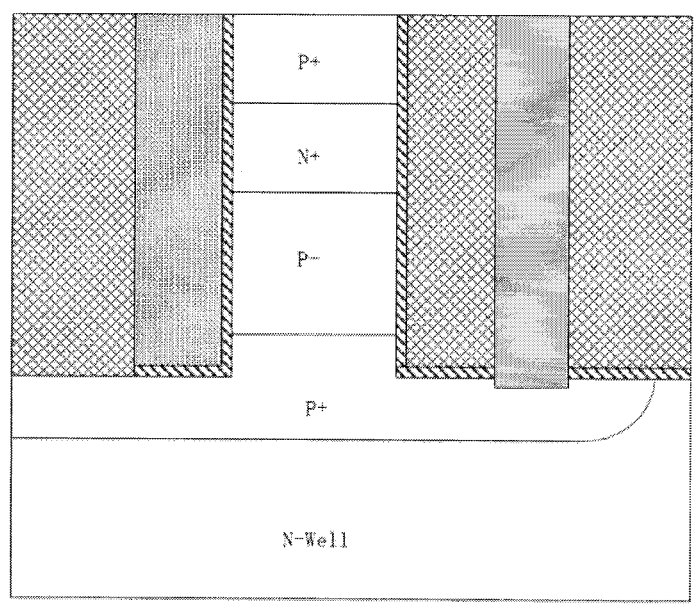
FIG. 12 is the cross-sectional view of a deep gate trench PMOSFET unit with a nano-wall integrated circuit structure with high integration density without N− lightly doped source region of one embodiment of this invention.
Figure 13A:
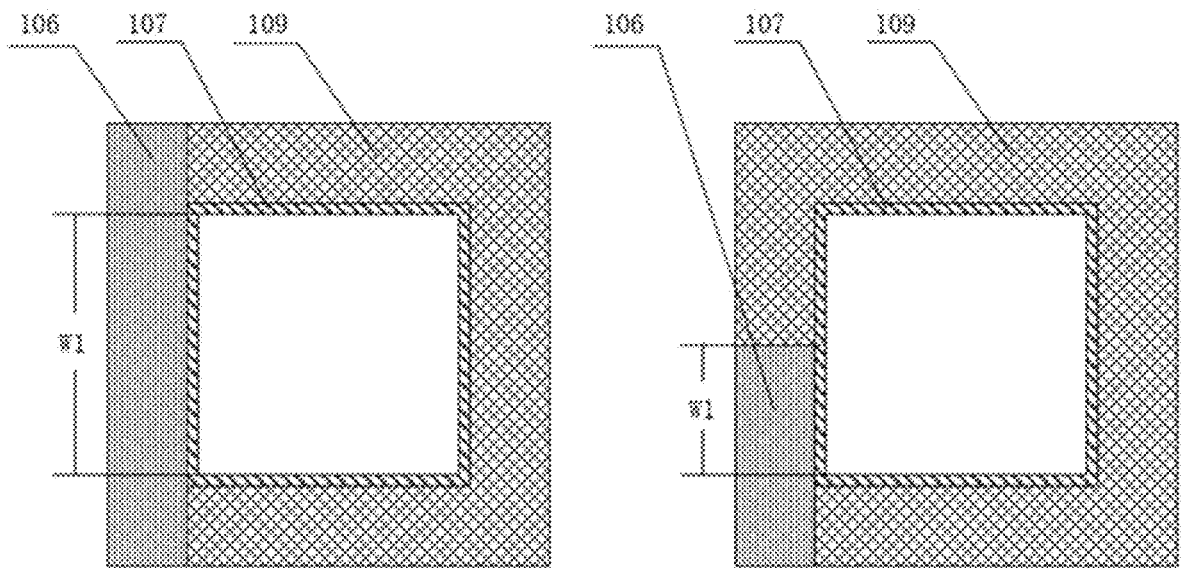
FIGS. 13A-D are the top view of a multiple combination of the gate electrode 106 and the PN functional region of a nano-wall integrated circuit structure with high integration density of one or more embodiments of this invention.
Figure 13B:
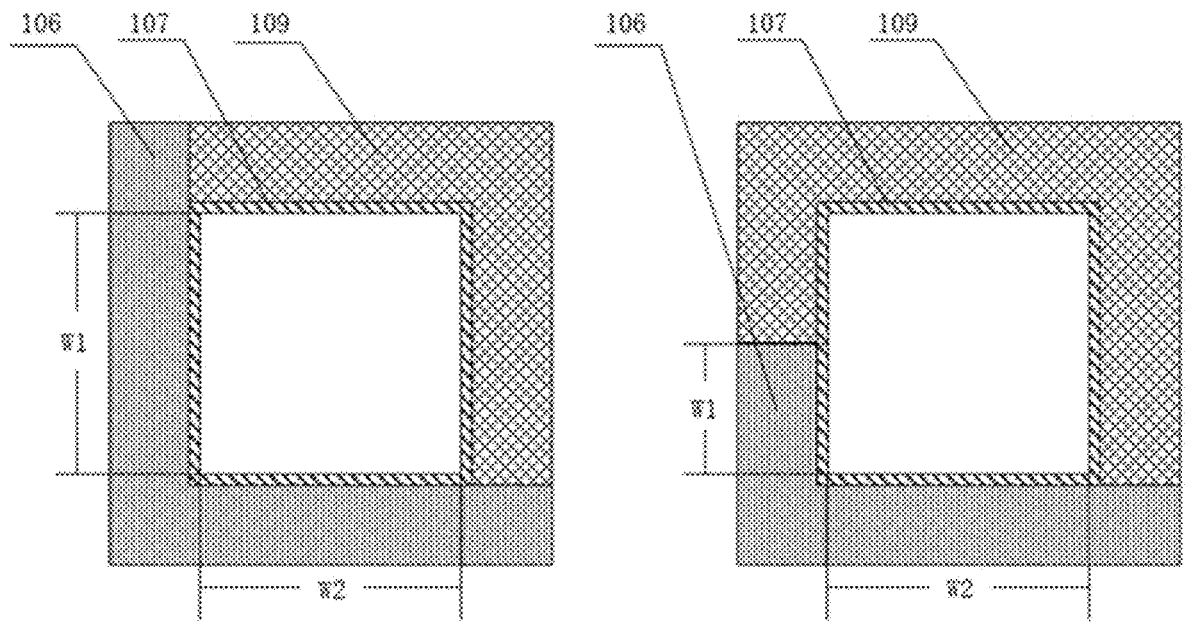
Figure 13C:
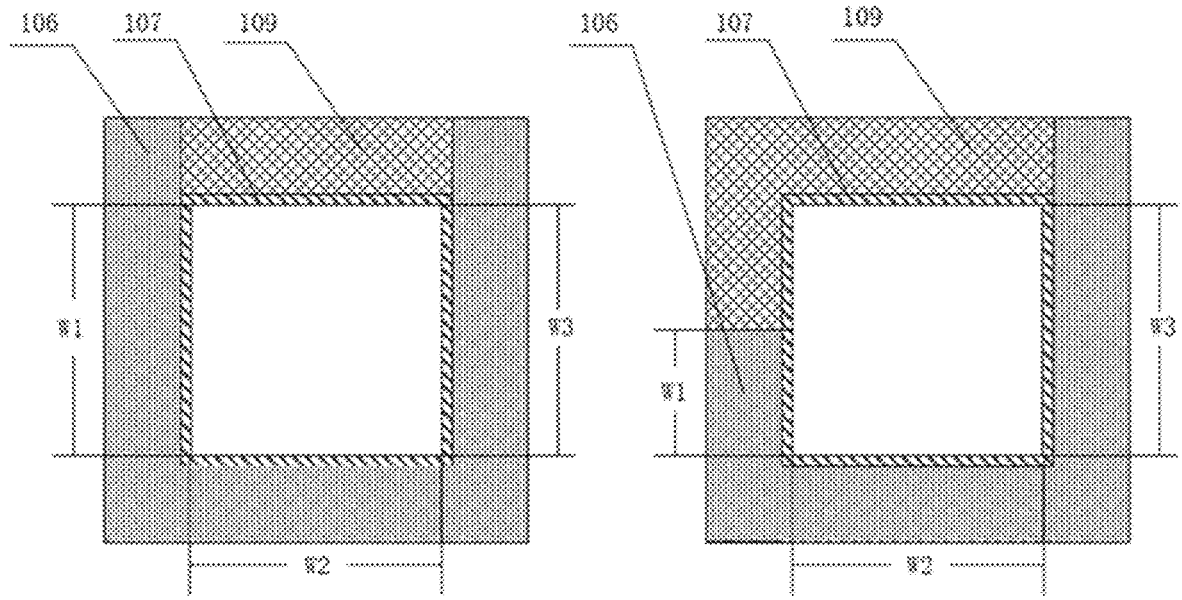
Figure 13D:
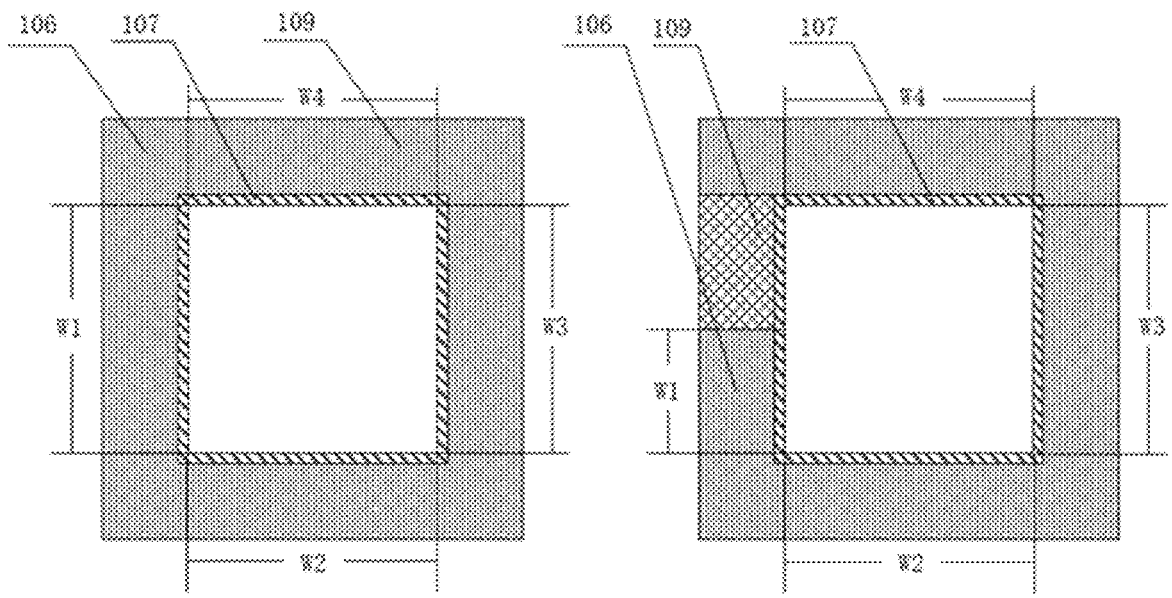
Figure 14:
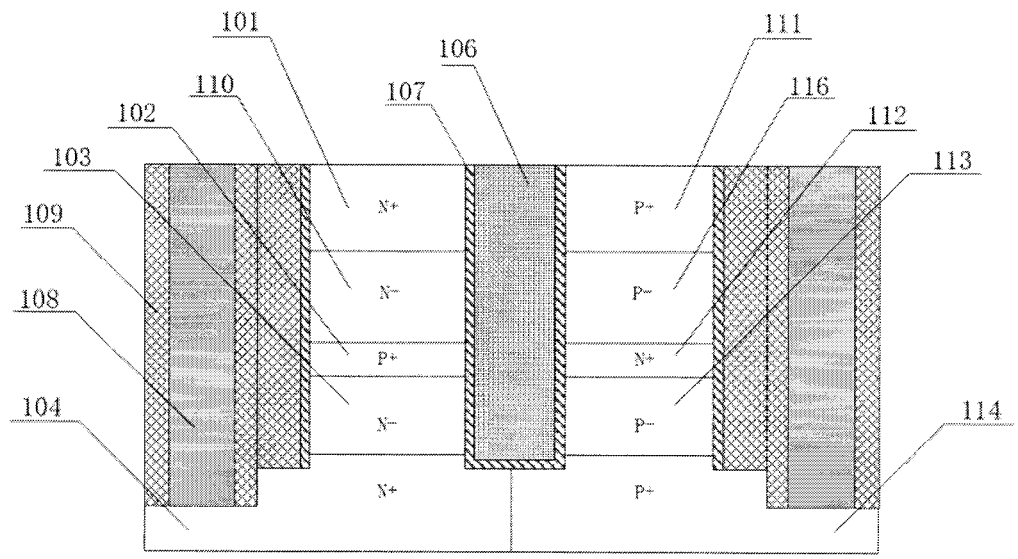
FIG. 14 is the cross-sectional view of the simulation structure of Example 1.

A computer three-dimensional simulation was performed based on the CMOS inverter structure using the technical embodiments 6 and 8 of this invention, and the simulation structure is shown in FIG. 14. For the NMOSFET, the N+ heavily doped source region is silicon, the depth or thickness is 20 nm, and the doping concentration is $1 \times 10^{20}$ cm$^{-3}$. The depth or thickness of the N− lightly doped source region is 20 nm, and the doping concentration is $1 \times 10^{16}$ cm$^{-3}$. The depth or thickness of the P+ channel region is 10 nm, and the doping concentration is $1 \times 10^{18}$ cm$^{-3}$. The depth or thickness of the N− lightly doped drain region is 20 nm, and the doping concentration is $1 \times 10^{16}$ cm$^{-3}$. The depth or thickness of the N+ heavily doped drain region is 20 nm, and the doping concentration is $1 \times 10^{20}$ cm$^{-3}$. For the PMOSFET, the depth or thickness of the P+ heavily doped source region is 20 nm, and the doping concentration is $1 \times 10^{20}$ cm$^{-3}$. The depth or thickness of the P− lightly doped source region is 20 nm, and the doping concentration is $1\times10^{16}$ cm$^{-3}$. The depth or thickness of the N+ channel region is 10 nm, and the doping concentration is $1\times10^{18}$ cm$^{-3}$. The depth or thickness of the P− lightly doped drain region is 20 nm, and the doping concentration is $1\times10^{16}$ cm$^{-3}$. The depth or thickness of the P+ heavily doped drain region is 20 nm, and the doping concentration is $1\times10^{20}$ cm$^{-3}$. The gate material is polysilicon, and the depth is 2 nm below the bottom surface of the N− lightly doped drain region. The gate dielectric is silicon dioxide with a thickness of 1 nm; the channel width of the NMOSFET is 20 nm, and the channel width-to-length ratio is 2:1. The channel width of the PMOSFET is three times the width of the channel of the NMOSFET, that is, 60 nm, and the channel width-to-length ratio is 6:1. The lead metal of the two transistor drains is Ti, and the depth is 10 nm below the bottom surface of the N− lightly doped drain region. The input voltage of transient simulation is a periodically changing square wave signal, the input low level is 0V, the input high level is 1.5V, and the level transition time from high to low and from low to high is $1\times10^{-11}$ s.

Figure 15:
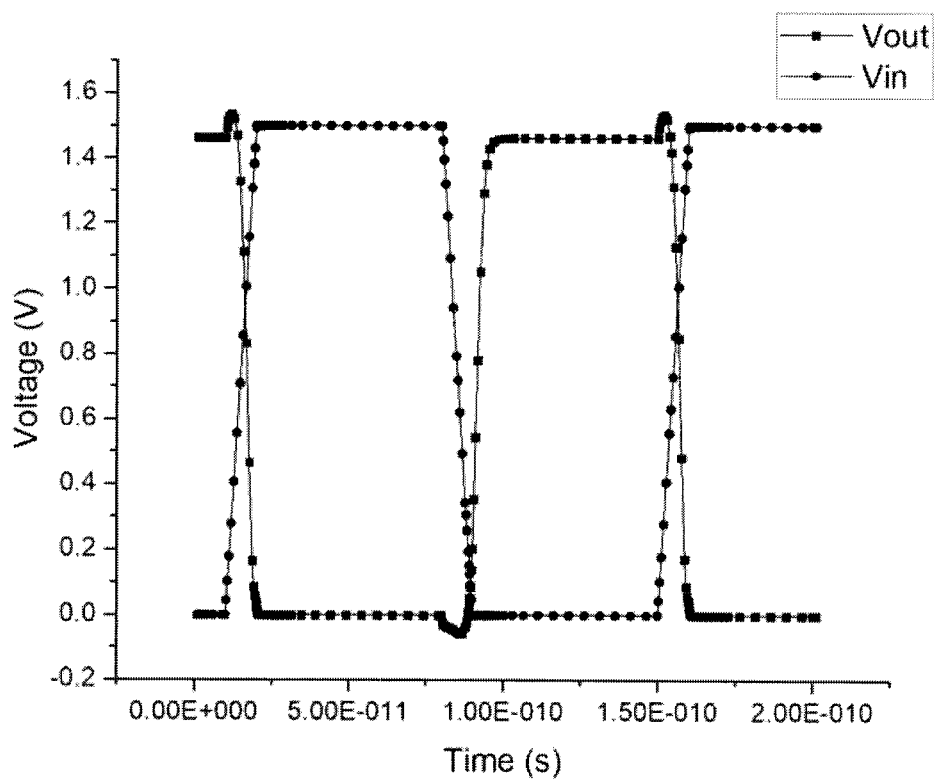
FIG. 15 is the transient response curves obtained by simulation of Example 1.

The simulation results are shown in the attached drawings of the specification, and FIG. 15 is the transient response curves obtained by the simulation. It can be seen from the simulation results that the common gate of NMOSFET and PMOSFET can realize the function of CMOS inverter IC. Without careful optimization, NWaFET devices with a channel length of 10 nm have achieved inverter IC switching times of less than 10 ps.

Example 2

Figure 16:
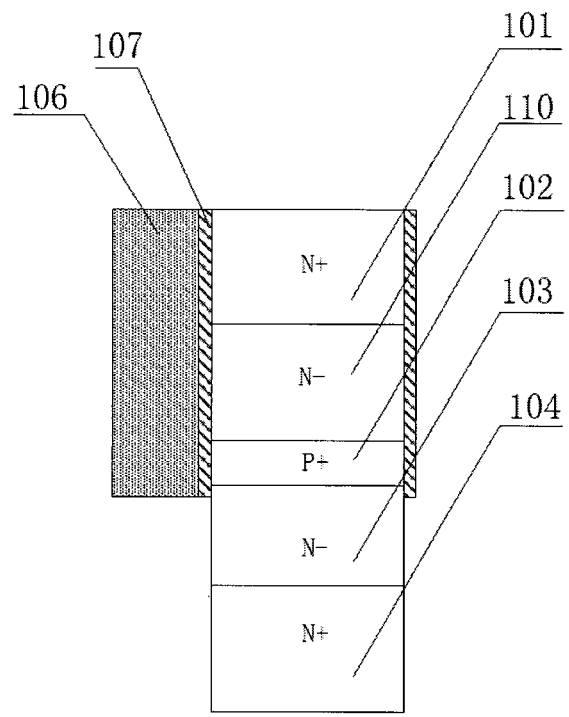
FIG. 16 is the cross-sectional view of the simulation structure of Example 2.

A computer three-dimensional simulation was performed based on the NMOSFET structure using the technical embodiment 4 of this invention, and the cross-sectional view of the simulation structure is shown in FIG. 16. The N+ heavily doped source region material is silicon, the depth or thickness is 10 nm, and the doping concentration is $1\times10^{20}$ cm$^{-3}$. The depth or thickness of the N− lightly doped source region is 20 nm, and the doping concentration is $1\times10^{17}$ cm$^{-3}$. The depth or thickness of the P+ channel is 0.543 nm, and the doping concentration is $2\times10^{20}$ cm$^{-3}$. The depth or thickness of the N− lightly doped drain region is 20 nm, and the doping concentration is $1\times10^{17}$ cm$^{-3}$. The depth or thickness of the N+ heavily doped drain region is 10 nm, and the doping concentration is $1\times10^{20}$ cm$^{-3}$. The gate material is polysilicon, and the depth is 2 nm below the bottom surface of the P+ channel region. The gate dielectric material is silicon dioxide with a thickness of 1.1 nm. The gate is arranged on one side of the PN functional area, the corresponding channel width is 5 nm, and the channel width-to-length ratio is about 9.2:1.

Figure 17:
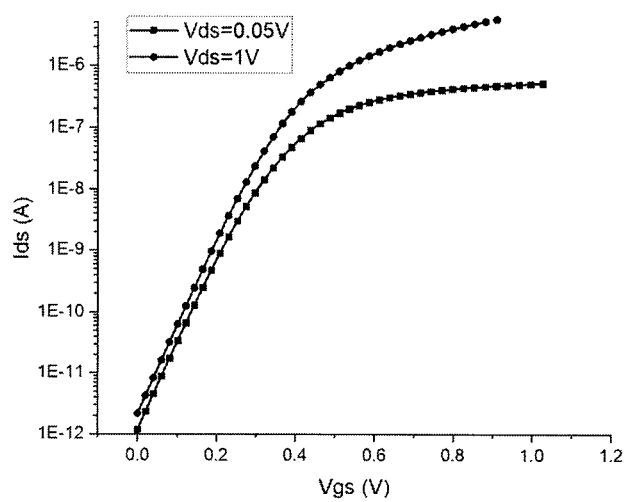
FIG. 17 is the transfer characteristic curves obtained by simulation of Example 2.
Figure 18:
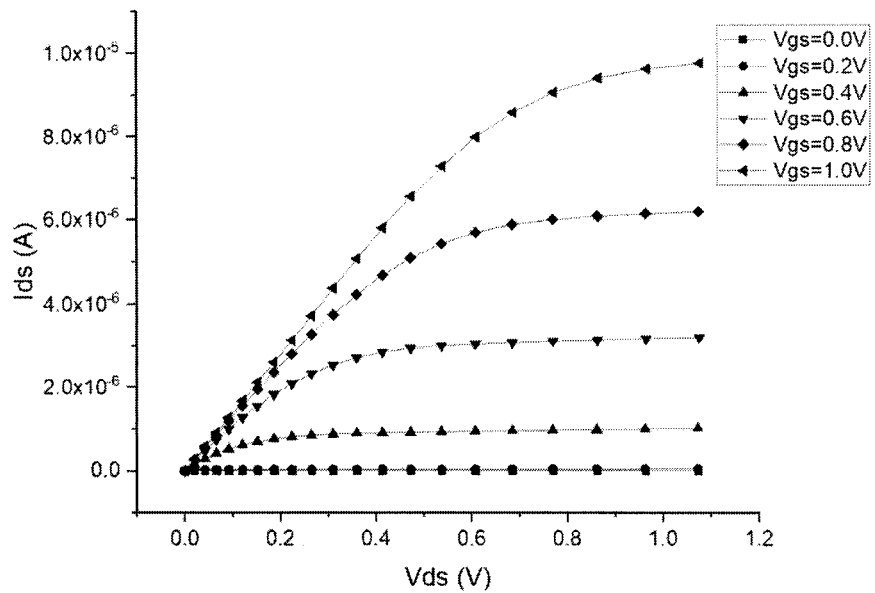
FIG. 18 is the output characteristic curves obtained by simulation of Example 2.
Figure 19:
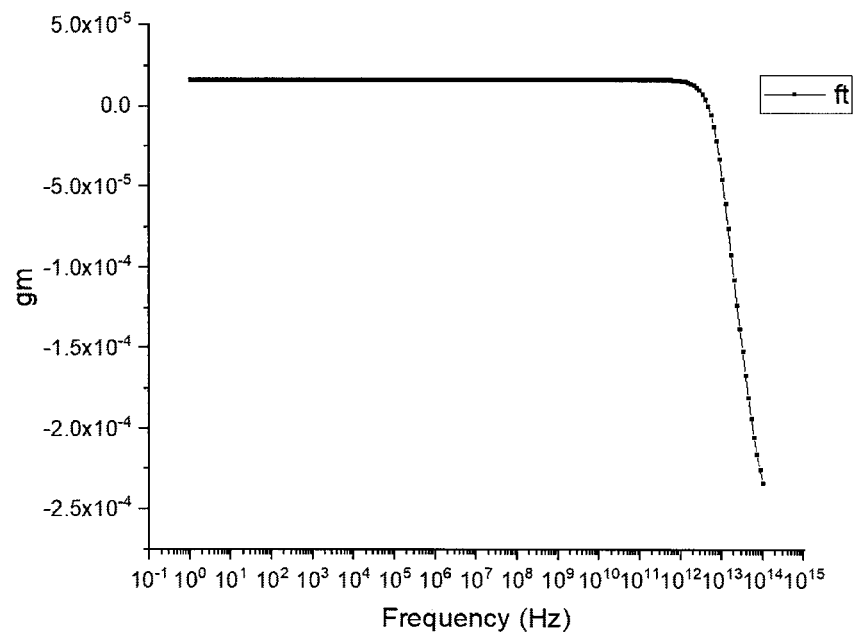
FIG. 19 is the frequency response curve obtained by simulation of Example 2.

The simulation results are shown in the attached drawings of the specification, and FIG. 17 is the transfer characteristic curves obtained by the simulation, and FIG. 18 is the output characteristic curves obtained by the simulation. It can be seen from the simulation results that the NMOSFET structure using the technical embodiment 4 of this invention can obtain transistor characteristics as expected when the channel length is 0.543 nm, and the calculated threshold voltage is 0.36V when the source-drain voltage $V_{ds}$ is 0.05V. The on-off ratio can reach $1\times10^6$. FIG. 19 shows the frequency response curve obtained by the simulation. It can be seen from the simulation result that the cut off frequency $f_t$ of the device is 2.33 THz.

Example 3

Figure 20:
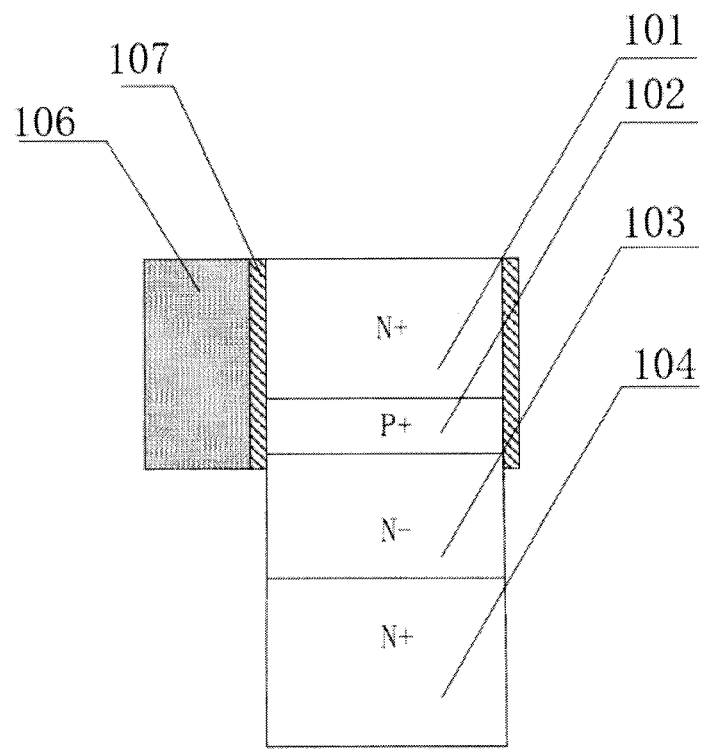
FIG. 20 is the cross-sectional view of the simulation structure of Example 3.

A computer three-dimensional simulation was performed based on the NMOSFET structure using the technical embodiment 2 of this invention, and the cross-sectional view of the simulation structure is shown in FIG. 20. The N+ heavily doped source region material is SiGe, the depth or thickness is 10 nm, and the doping concentration is $1\times10^{20}$ cm$^{-3}$. The depth or thickness of the P+ channel is 7 nm, and the doping concentration is $5\times10^{19}$ cm$^{-3}$. The depth or thickness of the N− lightly doped drain region is 10 nm, and the doping concentration is $1\times10^{15}$ cm$^{-3}$. The depth or thickness of the N+ heavily doped drain region is 10 nm, and the doping concentration is $1\times10^{20}$ cm$^{-3}$. The gate material is polysilicon, and the depth is flush with the bottom surface of the P+ channel region. The gate dielectric material is silicon dioxide, and the thickness is 2 nm. The gate is arranged on three sides of the PN functional area, the corresponding channel width is 21 nm, and the channel width-to-length ratio is 3:1.

Figure 21:
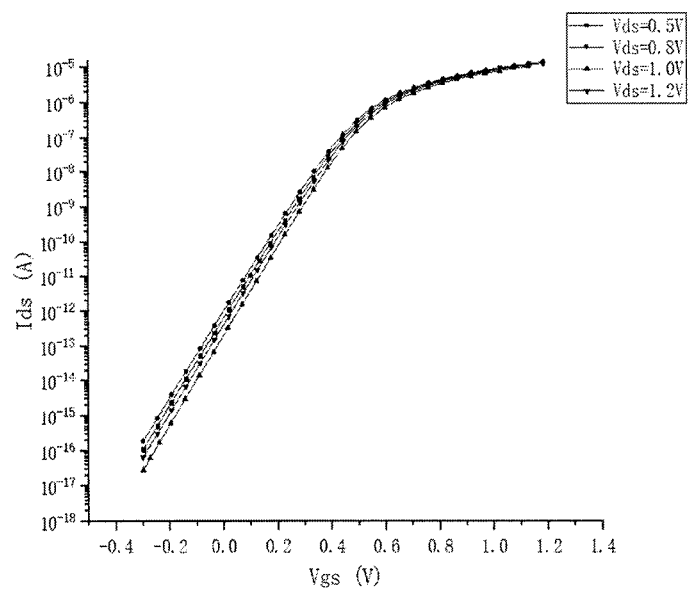
FIG. 21 is the transfer characteristic curves obtained by simulation of Example 3.
Figure 22:
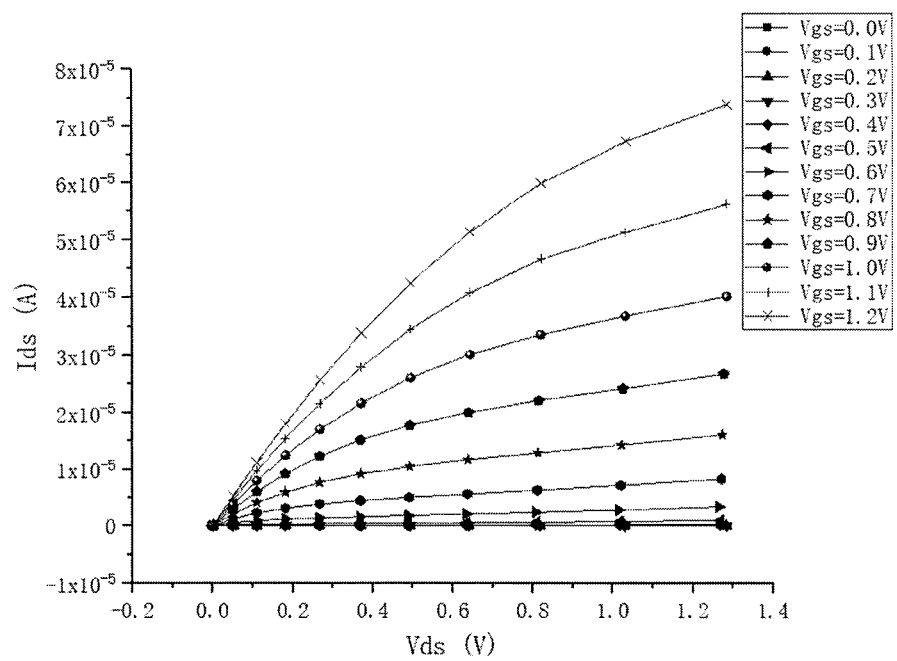
FIG. 22 is the output characteristic curves obtained by simulation of Example 3.

The simulation results are shown in the attached drawings of the specification, and FIG. 21 is the transfer characteristic curves obtained by the simulation, and FIG. 22 is the output characteristic curves obtained by the simulation. It can be seen from the simulation results that the NMOSFET structure using the technical embodiment 2 of this invention can obtain transistor characteristics as expected, and the calculated threshold voltage is 0.7V when the source-drain voltage $V_{ds}$ is 1.2V. The on-off ratio can reach $1\times10^8$.

Example 4

A computer three-dimensional simulation was performed based on the NMOSFET structure using the technical embodiment 4 of this invention, and the cross-sectional view of the simulation structure is shown in FIG. 16. The N+ heavily doped source region material is silicon, the depth or thickness is 10 nm, and the doping concentration is $1\times10^{20}$ cm$^{-3}$. The depth or thickness of the N− lightly doped source region is 10 nm, and the doping concentration is $1\times10^{17}$ cm$^3$. The depth or thickness of the P+ channel is 0.543 nm. The depth or thickness of the N− lightly doped drain region is 10 nm, and the doping concentration is $1\times10^{17}$ cm$^{-3}$. The depth or thickness of the N+ heavily doped drain region is 10 nm, and the doping concentration is $1\times10^{20}$ cm$^{-3}$. The gate material is polysilicon, and the depth is 2 nm below the bottom surface of the P+ channel region. The gate dielectric material is silicon dioxide with a thickness of 1.1 nm. The gate is arranged on four sides of the PN functional area, the corresponding channel width is 20 nm, and the channel width-to-length ratio is about 36.8:1.

Figure 23:
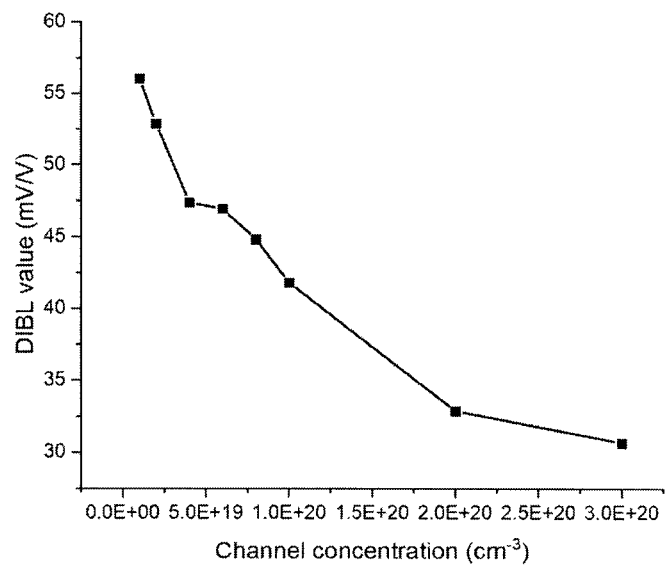
FIG. 23 is the curve of the DIBL value with the change of the doping concentration of the P+ channel region obtained by the simulation of Example 4.

FIG. 23 shows the change of DIBL value when the doping concentration of the P+ channel region increases from $1\times10^{19}$ cm$^{-3}$ to $3\times10^{20}$ cm$^{-3}$. When the doping concentration of the P+ channel region increases, it can be observed that the DIBL value gradually decreases, indicating that the highly doped channel region of the NWaFET structure can effectively suppress the DIBL effect.

Example 5

Figure 24:
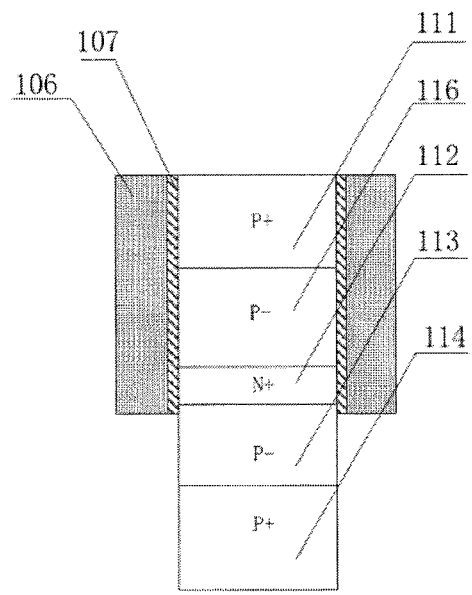
FIG. 24 is the cross-sectional view of the simulation structure of Example 5.

A computer three-dimensional simulation was performed based on the NMOSFET structure using the technical embodiment 8 of this invention, and the cross-sectional view of the simulation structure is shown in FIG. 24. The P+ heavily doped source region material is silicon, the depth or thickness is 10 nm, and the doping concentration is $1\times10^{20}$ cm$^{-3}$. The depth or thickness of the P− lightly doped source region is 20 nm, and the doping concentration is $1\times10^{16}$ cm$^{-3}$. The depth or thickness of the N+ channel is 10 nm. The depth or thickness of the P− lightly doped drain region is 20 nm, and the doping concentration is $1\times10^{17}$ cm$^{-3}$. The depth or thickness of the P+ heavily doped drain region is 10 nm, and the doping concentration is $1\times10^{20}$ cm$^{-3}$. The gate material is polysilicon, and the depth is 5 nm below the bottom surface of the N+ channel region. The gate dielectric material is silicon dioxide with a thickness of 3 nm. The gate is arranged on four sides of the PN functional area, the corresponding channel width is 40 nm, and the channel width-to-length ratio is about 4:1.

Figure 25:
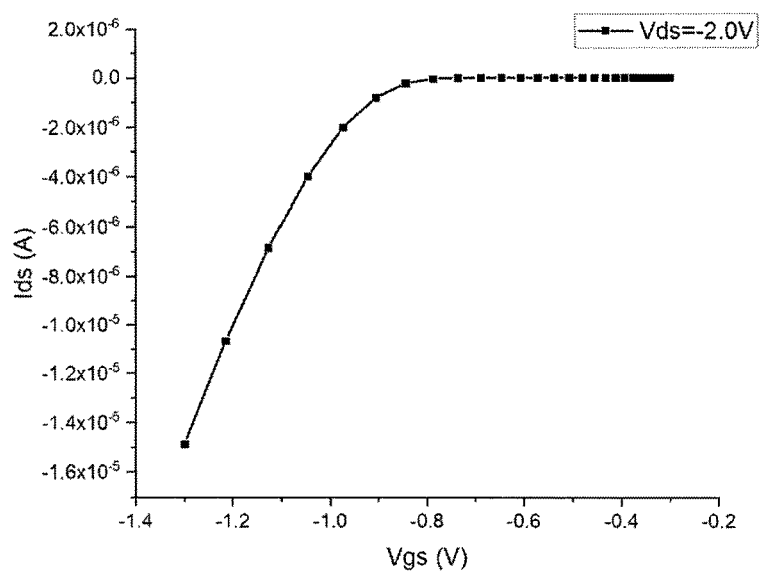
FIG. 25 is the transfer characteristic curves obtained by simulation of Example 5.
Figure 26:
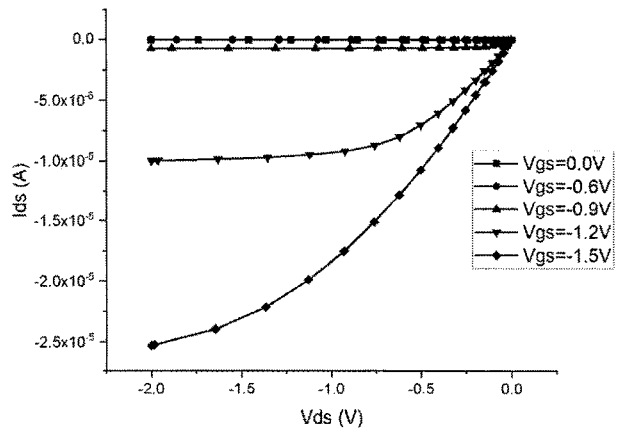
FIG. 26 is the output characteristic curves obtained by simulation of Example 5.

The simulation results are shown in the attached drawings of the specification, and FIG. 25 is the transfer characteristic curves obtained by the simulation, and FIG. 26 is the output characteristic curves obtained by the simulation. It can be seen from the simulation results that the NMOSFET structure using the technical embodiment 8 of this invention can obtain transistor characteristics as expected, and the calculated threshold voltage is −0.9V when the source-drain voltage $V_{ds}$ is −2V. The on-off ratio can reach $1\times10^{8}$.

The invention claimed is:

1. A nano-wall integrated circuit structure (NWaFET), comprising:
    a well semiconductor region having a first conductivity type,
    a heavily doped drain region on the well semiconductor region, wherein the heavily doped drain region has a second conductivity type and includes an upper portion and a lower portion, and the lower portion is wider than the upper portion and has bottom and side surfaces surrounded by the well semiconductor region,
    a lightly doped drain region above the heavily doped drain region, the lightly doped drain region having the second conductivity type;
    a heavily doped, first conductivity type channel semiconductor region above the lightly doped drain region;
    a heavily doped, second conductivity type source region above the channel semiconductor region, wherein the heavily doped source region comprises a narrow bandgap pseudocrystalline, narrow bandgap polycrystalline or single crystal silicon semiconductor;
    an insulating gate dielectric and a gate electrode on a first side surface of each of the upper portion of the heavily doped drain region, the lightly doped drain region, the channel semiconductor region, and the heavily doped source region; and
    an insulating material on a second side surface of each of the heavily doped source region, the channel semiconductor region, the lightly doped drain region, and the upper portion of the heavily doped drain region, and
    a drain electrode in contact with the heavily doped drain region, in the insulating material and isolated from the heavily doped source region, the channel semiconductor region, and the lightly doped drain region,
    wherein:
        the insulating gate dielectric and the gate electrode have a lowermost surface that is higher than a first interface between the heavily doped drain region and the well semiconductor region and lower than a second interface between the lightly doped drain region and the heavily doped drain region,
        the gate electrode comprises heavily doped polycrystalline silicon, a refractory metal silicide, a refractory metal, or a combination thereof;
        the insulated gate dielectric isolates the gate electrode from the heavily doped source region, the channel semiconductor region, the lightly doped drain region, and the heavily doped drain region, and
        a contact surface between the drain electrode and the heavily doped drain region is lower than the second interface.

2. The nano-wall integrated circuit structure of claim 1, wherein the channel semiconductor region has a thickness that is less than 12 nm.

3. The nano-wall integrated circuit structure of claim 2, wherein the channel semiconductor region has a doping concentration that is at least 2 orders of magnitude higher than that of the lightly doped drain region.

4. The nano-wall integrated circuit structure of claim 3, wherein the first conductivity type is P-type, and the second conductivity type is N-type.

5. The nano-wall integrated circuit structure of claim 4, further comprising a lightly doped source region above the channel semiconductor region and below the heavily doped source region, wherein the insulating gate dielectric and the gate electrode are on a first side surface of each of the upper portion of the heavily doped drain region, the lightly doped drain region, the channel semiconductor region, the lightly doped source region, and the heavily doped source region, the insulating gate dielectric isolates the gate electrode from the heavily doped drain region, the lightly doped drain region, the channel semiconductor region, the lightly doped source region, and the heavily doped source region, and the drain electrode is isolated from the lightly doped drain region, the channel semiconductor region, the lightly doped source region, and the heavily doped source region by the insulating material.

6. The nano-wall integrated circuit structure of claim 5, wherein the lightly doped source region comprises a narrow bandgap pseudocrystalline, narrow bandgap polycrystalline or single crystal silicon semiconductor, and the lightly doped source region has a doping concentration that is lower than that of the heavily doped source region and the channel semiconductor region.

7. The nano-wall integrated circuit structure of claim 3, further comprising a lightly doped source region above the channel semiconductor region and below the heavily doped source region, wherein the insulating gate dielectric and the gate electrode are on a first side surface of each of the upper portion of the heavily doped drain region, the lightly doped drain region, the channel semiconductor region, the lightly doped source region, and the heavily doped source region, the insulating gate dielectric isolates the gate electrode from the heavily doped drain region, the lightly doped drain region, the channel semiconductor region, the lightly doped source region, and the heavily doped source region, and the drain electrode is isolated from the lightly doped drain region, the channel semiconductor region, the lightly doped source region, and the heavily doped source region by the insulating material.

8. The nano-wall integrated circuit structure of claim 7, wherein the lightly doped source region comprises a narrow bandgap pseudocrystalline, narrow bandgap polycrystalline or single crystal silicon semiconductor, and the lightly doped source region has a doping concentration that is lower than that of the heavily doped source region and the channel semiconductor region.

9. The nano-wall integrated circuit structure of claim 3, wherein the first conductivity type is N-type, and the second conductivity type is P-type.

10. The nano-wall integrated circuit structure of claim 9, further comprising a lightly doped source region above the channel semiconductor region and below the heavily doped source region, wherein the insulating gate dielectric and the gate electrode are on a first side surface of each of the upper portion of the heavily doped drain region, the lightly doped drain region, the channel semiconductor region, the lightly doped source region, and the heavily doped source region, the insulating gate dielectric isolates the gate electrode from the heavily doped drain region, the lightly doped drain region, the channel semiconductor region, the lightly doped source region, and the heavily doped source region, and the drain electrode is isolated from the lightly doped drain region, the channel semiconductor region, the lightly doped source region, and the heavily doped source region by the insulating material.

11. The nano-wall integrated circuit structure of claim 10, wherein the lightly doped source region comprises a narrow bandgap pseudocrystalline, narrow bandgap polycrystalline or single crystal silicon semiconductor, and the lightly doped source region has a doping concentration that is lower than that of the heavily doped source region and the channel semiconductor region.

12. The nano-wall integrated circuit structure of claim 2, further comprising a lightly doped source region above the channel semiconductor region and below the heavily doped source region, wherein the insulating gate dielectric and the gate electrode are on a first side surface of each of the upper portion of the heavily doped drain region, the lightly doped drain region, the channel semiconductor region, the lightly doped source region, and the heavily doped source region, the insulating gate dielectric isolates the gate electrode from the heavily doped drain region, the lightly doped drain region, the channel semiconductor region, the lightly doped source region, and the heavily doped source region, and the drain electrode is isolated from the lightly doped drain region, the channel semiconductor region, the lightly doped source region, and the heavily doped source region by the insulating material.

13. The nano-wall integrated circuit structure of claim 12, wherein the lightly doped source region comprises a narrow bandgap pseudocrystalline, narrow bandgap polycrystalline or single crystal silicon semiconductor, and the lightly doped source region has a doping concentration that is lower than that of the heavily doped source region and the channel semiconductor region.

14. A nano-wall integrated circuit structure (NWaFET), comprising:
   a well semiconductor region having a first conductivity type,
   a heavily doped drain region on the well semiconductor region, wherein the heavily doped drain region has a second conductivity type and includes an upper portion and a lower portion, and the lower portion is wider than the upper portion and has bottom and side surfaces surrounded by the well semiconductor region,
   a lightly doped drain region above the heavily doped drain region, the lightly doped drain region having the second conductivity type;
   a heavily doped, first conductivity type channel semiconductor region above the lightly doped drain region;
   a heavily doped, second conductivity type source region above the channel semiconductor region, wherein the heavily doped source region comprises a narrow bandgap pseudocrystalline, narrow bandgap polycrystalline or single crystal silicon semiconductor;
   an insulating gate dielectric and a gate electrode on a first side surface of each of the upper portion of the heavily doped drain region, the lightly doped drain region, the channel semiconductor region, and the heavily doped source region; and
   an insulating material on a second side surface of each of the heavily doped source region, the channel semiconductor region, the lightly doped drain region, and the upper portion of the heavily doped drain region, and
   a drain electrode in contact with the heavily doped drain region, in the insulating material and isolated from the heavily doped source region, the channel semiconductor region, and the lightly doped drain region,
   wherein:
      the insulating gate dielectric and the gate electrode have a lowermost surface that is higher than a first interface between the lightly doped drain region and the heavily doped drain region and lower than a second interface between the lightly doped drain region and the channel semiconductor region,
      the gate electrode comprises heavily doped polycrystalline silicon, a refractory metal silicide, a refractory metal, or a combination thereof;
      the insulated gate dielectric isolates the gate electrode from the heavily doped source region, the channel semiconductor region, the lightly doped drain region, and the heavily doped drain region, and
      a contact surface between the drain electrode and the heavily doped drain region is lower than the second interface.

15. The nano-wall integrated circuit structure of claim 14, wherein the channel semiconductor region has a thickness that is less than 12 nm.

16. The nano-wall integrated circuit structure of claim 15, wherein the channel semiconductor region has a doping concentration that is at least 2 orders of magnitude higher than that of the lightly doped drain region.

17. The nano-wall integrated circuit structure of claim 16, further comprising a lightly doped source region above the channel semiconductor region and below the heavily doped source region, wherein the insulating gate dielectric and the gate electrode are on a first side surface of each of the upper portion of the heavily doped drain region, the lightly doped drain region, the channel semiconductor region, the lightly doped source region, and the heavily doped source region, the insulating gate dielectric isolates the gate electrode from the heavily doped drain region, the lightly doped drain region, the channel semiconductor region, the lightly doped source region, and the heavily doped source region, and the drain electrode is isolated from the lightly doped drain region, the channel semiconductor region, the lightly doped source region, and the heavily doped source region by the insulating material.

18. The nano-wall integrated circuit structure of claim 17, wherein the lightly doped source region comprises a narrow bandgap pseudocrystalline, narrow bandgap polycrystalline or single crystal silicon semiconductor, and the lightly doped source region has a doping concentration that is lower than that of the heavily doped source region and the channel semiconductor region.

19. The nano-wall integrated circuit structure of claim 16, wherein the first conductivity type is P-type, and the second conductivity type is N-type.

20. The nano-wall integrated circuit structure of claim 16, wherein the first conductivity type is N-type, and the second conductivity type is P-type.

* * * * *